United States Patent
Chen et al.

(10) Patent No.: US 7,656,205 B2
(45) Date of Patent: Feb. 2, 2010

(54) DUAL-INJECTION LOCKED FREQUENCY DIVIDING CIRCUIT

(75) Inventors: Yi-Jan Emery Chen, Taipei (TW); Tang-Nian Luo, Taipei (TW)

(73) Assignee: National Taiwan University, Taipei (TW)

( * ) Notice: Subject to any disclaimer, the term of this patent is extended or adjusted under 35 U.S.C. 154(b) by 80 days.

(21) Appl. No.: 12/164,333

(22) Filed: Jun. 30, 2008

(65) Prior Publication Data

US 2009/0184739 A1  Jul. 23, 2009

(30) Foreign Application Priority Data

Jan. 21, 2008 (TW) .............................. 97102152 A

(51) Int. Cl.
*H03K 21/00* (2006.01)
(52) U.S. Cl. ...................................... 327/115; 327/117
(58) Field of Classification Search ................. 327/115, 327/117, 118
See application file for complete search history.

(56) References Cited

U.S. PATENT DOCUMENTS

| | | | | |
|---|---|---|---|---|
| 7,522,007 B2* | 4/2009 | Jang et al. | .................... | 331/172 |
| 7,522,008 B2* | 4/2009 | Jang et al. | .................... | 331/172 |
| 7,557,664 B1* | 7/2009 | Wu | .................... | 331/51 |
| 7,557,668 B2* | 7/2009 | Jang et al. | .................... | 331/167 |
| 2007/0257735 A1* | 11/2007 | Chan et al. | .................... | 331/16 |
| 2008/0278204 A1* | 11/2008 | Jang et al. | .................... | 327/118 |
| 2009/0027091 A1* | 1/2009 | Yamaguchi et al. | .................... | 327/118 |
| 2009/0033430 A1* | 2/2009 | Jang et al. | .................... | 331/57 |
| 2009/0085682 A1* | 4/2009 | Jang et al. | .................... | 331/117 FE |
| 2009/0102520 A1* | 4/2009 | Lee et al. | .................... | 327/115 |
| 2009/0184739 A1* | 7/2009 | Chen et al. | .................... | 327/115 |
| 2009/0251177 A1* | 10/2009 | Jang et al. | .................... | 327/118 |

OTHER PUBLICATIONS

"Superharmonic Injection-Locked Frequency Dividers", authored by H.R. Rategh, et al. and published on IEEE Journal of Solid-State Circuits, vol. 34, pp. 813-821, Jun. 1999.
"A 19GHz 0.5mW 0.35 μm CMOS Frequency Divider with Shunt-Peaking Enhancement", authored by Hui Wu, et al., and published on IEEE International Solid-State Circuits Conference, pp. 412-413 & p. 417, Feb. 2001.

(Continued)

*Primary Examiner*—Lincoln Donovan
*Assistant Examiner*—Thomas J Hiltunen
(74) *Attorney, Agent, or Firm*—Pearne & Gordon LLP

(57) ABSTRACT

A dual-injection locked frequency dividing circuit is proposed, which is designed for integration to a gigahertz signal processing circuit system for providing a frequency dividing function to gigahertz signals. The proposed circuit architecture is characterized by the provision of a dual-injection interface module on the input end for dividing the input signal into two parts for use as two injection signals, wherein the first injection signal is rendered in the form of a voltage signal and injected through a direct injection manner to the internal oscillation circuitry, while the second injection signal is rendered in the form of an electrical current and injected through a resonant circuit to the internal oscillation circuitry. This feature allow the proposed frequency dividing circuit to have broad frequency locking range and low power consumption.

23 Claims, 5 Drawing Sheets

OTHER PUBLICATIONS

"55 GHz CMOS Frequency Divider with 3.2 GHz Locking Range", authored by K. Yamamoto, et al. and published on Proc. 30th European Solid-State Circuits Conference, ESSCIRC 2001, pp. 135-138, Sep. 2004.

"A 2.4 GHz Fully Integrated Cascode-Cascade CMOS Doherty Power Amplifier", authored by Yang, et al. and published on IEEE Microwave and Wireless Components Letters, vol. 19, No. 3, Mar. 2008.

* cited by examiner

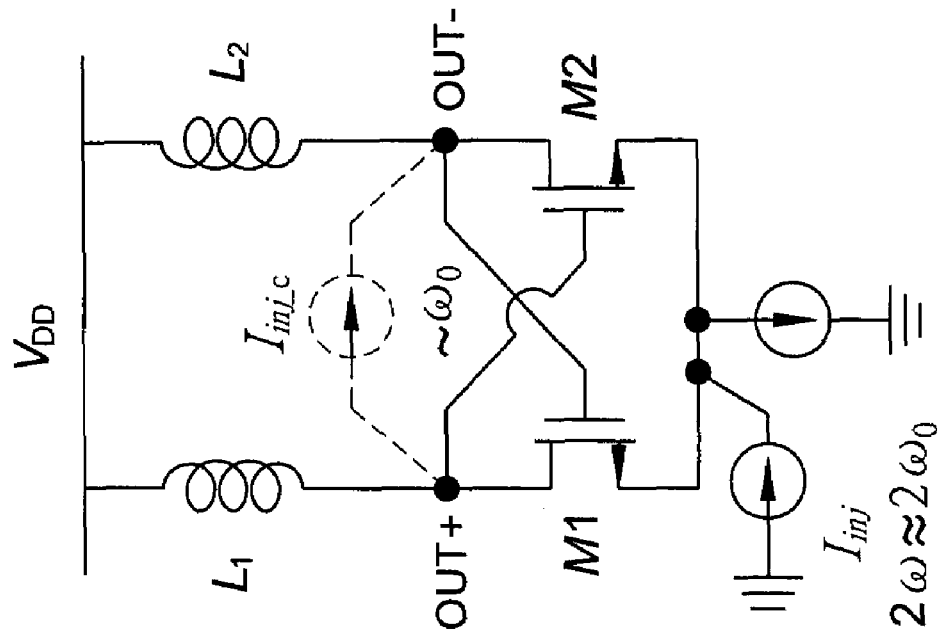
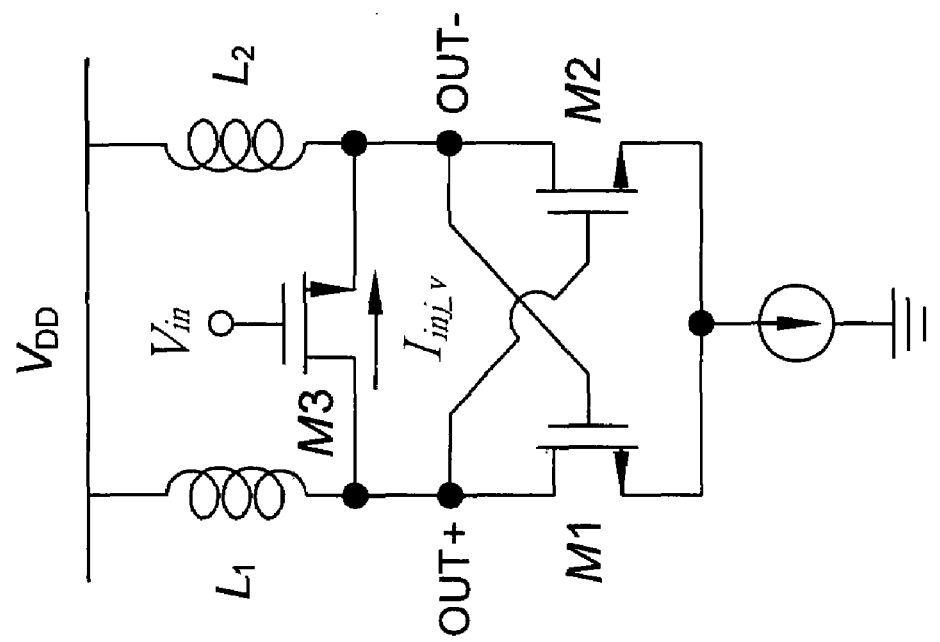
FIG. 3B
FIG. 3A

Frequency Locking Range (GHz)

DUAL-INJECTION LOCKED FREQUENCY DIVIDING CIRCUIT

BACKGROUND OF THE INVENTION

1. Field of the Invention

This invention relates to a dual-injection locked frequency dividing circuit which is designed for use with a gigahertz signal processing system, particularly of the type that operates in the frequency range from 35.7 GHz to 54.9 GHz (gigahertz), for providing a frequency dividing function to gigahertz signals.

2. Description of Related Art

With the advent of wireless digital communication technologies, such as wireless networking, mobile phones, GPS (Global Positioning System), and digital TV, the design and manufacture of high-speed digital circuit boards that operate with signals within the gigahertz range is in high demand in the electronics industry. Nowadays, the operating frequency of high-speed digital circuitry has advanced to the ranges of RF (radio frequency), microwave, and millimeter waves.

In the design of high-speed digital circuitry, frequency dividers are an important component that can convert a fixed signal frequency to a lower frequency. For high performance application purposes, the design of frequency divider circuitry typically requires a broader frequency locking range. Beside, in mobile applications, since mobile devices are battery-powered, the design of frequency divider circuitry for use in mobile devices further requires low power consumption.

Presently, in RF applications, the ILFD (injection-locked frequency divider) circuit architecture is a widely used technology. However, in practice, one drawback to the ILFD circuit architecture is that it can only offer a narrow frequency locking range which would be unsatisfactory and inadequate for use in broadband applications.

In view of the above-mentioned drawbacks of the prior art, it is an research effort in academic research institutes and electronics industry for a new and improved frequency divider circuit architecture which can operate with broad frequency locking range and low power consumption. Some research results have been disclosed in the following technical papers: (1) "*Superhamonic Injection-Locked Frequency Dividers*", authored by H. R. Rategh et al and published on IEEE Journal of Solid-State Circuits, Vol. 34, pp. 813-821, June 1999); (2) "*A 19 GHz 0.5 mW 0.35 μm CMOS Frequency Divider with Shunt-Peaking Enhancement*", authored by Hui Wu et al and published on IEEE International Solid-State Circuits Conference, pp. 412-413, 417, February 2001); and (3) "*55 GHz CMOS Frequency Divider with 3.2 GHz Locking Range*", authored by K Yamamoto et al and published on Proc. 30th European Solid-State Circuits Conference, ESSCIRC 2004, pp. 135-138, September 2004).

Among the above-listed papers, H. R. Rategh et al teaches a frequency divider circuit architecture that operates at 3 GHz with a frequency locking range of 370 MHz; Hui Wu et al teaches a circuit architecture that operates at 19 GHz with a frequency locking range of 1.35 MHz; and K Yamamoto et al teaches still another circuit architecture that operates at 55 GHz with a frequency locking range of 3.2 GHz.

For broadband applications within the range from 35.7 GHz to 54.9 GHz, the frequency divider circuit architecture disclosed by K Yamamoto et al is a suitable technology. However, still one drawback of this technology is that its frequency locking range is only 3.2 GHz, which is still unsatisfactory and inadequate for use in such broadband applications.

SUMMARY OF THE INVENTION

It is therefore an objective of this invention to provide a dual-injection locked frequency dividing circuit which can operate with a broader frequency locking range than prior art.

It is another objective of this invention to provide a dual-injection locked frequency dividing circuit which can operate with less power consumption than prior art.

In application, the dual-injection locked frequency dividing circuit according to the invention is designed for use with a gigahertz signal processing system, particularly of the type that operates in the frequency range from 35.7 GHz to 54.9 GHz, for providing a frequency dividing function to gigahertz signals.

In architecture, the dual-injection locked frequency dividing circuit according to the invention comprises: (A) a dual-injection interface module; (B) a first cross-switching circuit module; (C) a second cross-switching circuit module; (D) a first resonant circuit module; and (E) a second resonant circuit module.

The dual-injection locked frequency dividing circuit according to the invention is characterized by the provision of a dual-injection interface module on the input end for dividing the input signal into two parts for use as two injection signals, wherein the first injection signal is rendered in the form of a voltage signal and injected through a direct injection manner to the internal oscillation circuitry, while the second injection signal is rendered in the form of an electrical current and injected through a resonant circuit to the internal oscillation circuitry. This feature allow the proposed frequency dividing circuit to have broad frequency locking range and low power consumption.

BRIEF DESCRIPTION OF DRAWINGS

The invention can be more fully understood by reading the following detailed description of the preferred embodiments, with reference made to the accompanying drawings, wherein:

FIG. 3A shows an equivalent circuit used to explain the response of the frequency dividing circuit of the invention to the first injection signal $S_1$;

FIG. 3B shows an equivalent circuit used to explain the response of the frequency dividing circuit of the invention to the second injection signal $S_2$;

DETAILED DESCRIPTION OF PREFERRED EMBODIMENTS

The dual-injection locked frequency dividing circuit according to the invention is disclosed in full details by way of preferred embodiments in the following with reference to the accompanying drawings.

Application and Function of the Invention

Figure 1:
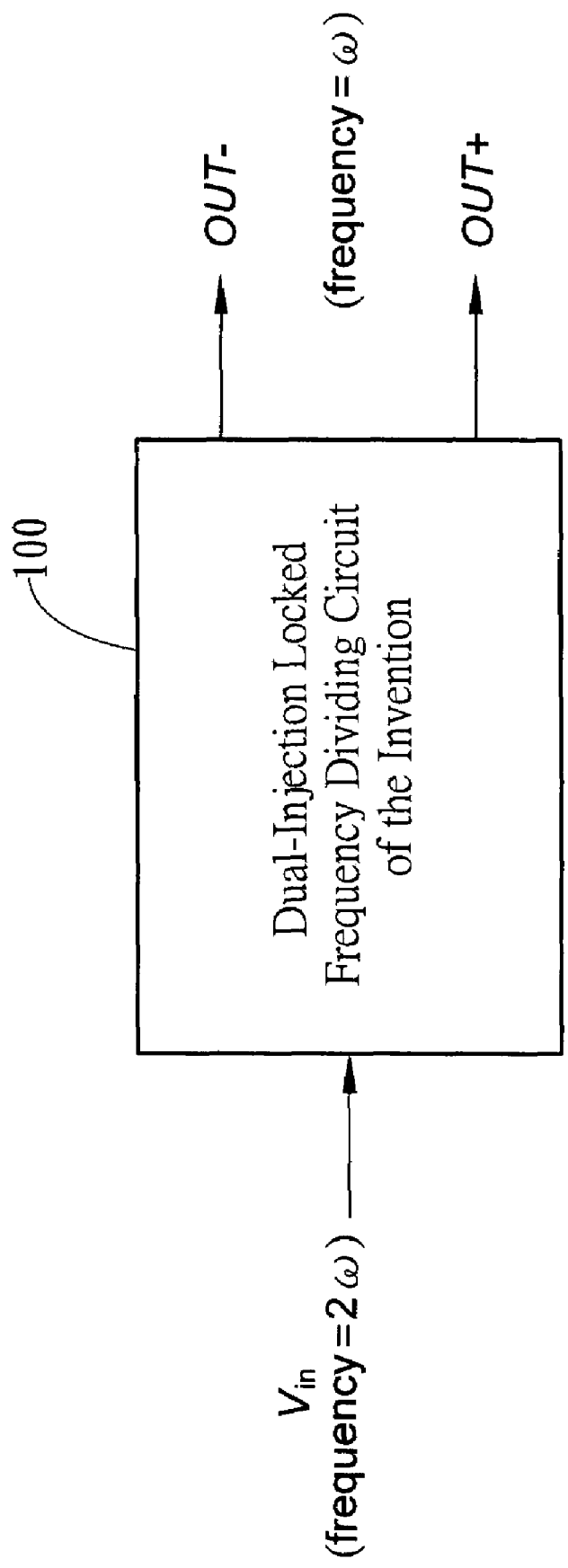
FIG. 1 is a schematic diagram showing the I/O functional model of the frequency dividing circuit of the invention.

FIG. 1 is a schematic diagram showing the input/output (I/O) functional model of the dual-injection locked frequency dividing circuit according to the invention (which is here encapsulated in a box indicated by the reference numeral 100, and is hereinafter referred in short as "frequency dividing circuit"). As shown, the frequency dividing circuit of the invention 100 is designed with an I/O interface having a signal input port $V_{in}$ and a pair of differential signal output ports including a positive differential output port (OUT+) and a negative differential output port (OUT−). The signal input port $V_{in}$ is used to receive an input signal (whose frequency is represented by 2ω in FIG. 1).

In operation, the frequency dividing circuit of the invention 100 is capable of performing a divide-by-2 frequency downconverting operation on the input signal $V_{in}$ to thereby generate a pair of differential output signals at the output ports (OUT+, OUT−) whose frequencies are each equal to half of the input signal frequency (i.e., input frequency=2ω and output frequency=ω)

In practical applications, for example, the frequency dividing circuit of the invention 100 can be utilized for integration to a frequency synthesizer or a PLL (phase-locked loop) circuit. However, beside these applications, various other applications are also possible.

Architecture of the Invention

Figure 2:
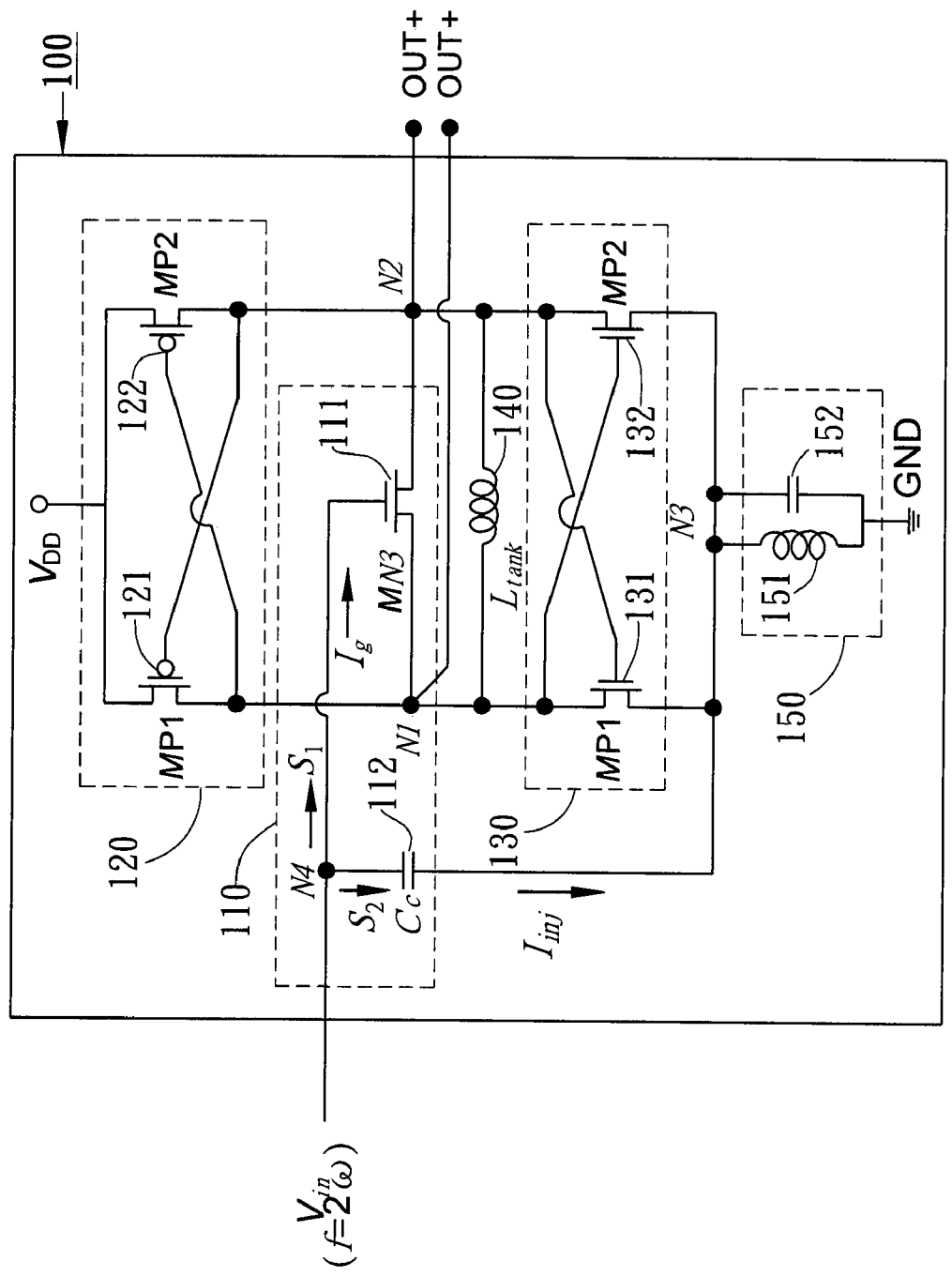
FIG. 2 is a schematic diagram showing the internal architecture of the frequency dividing circuit of the invention.

As shown in FIG. 2, in architecture, the frequency dividing circuit of the invention 100 comprises: (A) a dual-injection interface module 110; (B) a first cross-switching circuit module 120; (C) a second cross-switching circuit module 130; (D) a first resonant circuit module 140; and (E) a second resonant circuit module 150. Firstly, the respective attributes and functions of these constituent components of the invention are described in details in the following.

Dual-Injection Interface Module 110

The dual-injection interface module 110 is composed of a switching element 111 and a capacitive element ($C_c$) 112. In operation, the dual-injection interface module 110 is used to receive the input signal $V_{in}$ and bifurcate the input signal $V_{in}$ at a fourth node (N4) into at least two signals respectively serving as a first injection signal $S_1$ and a second injection signal $S_2$. The first injection signal $S_1$ is injected in the form of voltage (i.e., the original form of the signal input port $V_{in}$) in a switched manner via the switching element 111 to both a first node (N1) and a second node (N2) which are respectively connected to the positive differential output port (OUT+) and the negative differential output port (OUT−). On the other hand, the second injection signal $S_2$ is injected in the form of an electrical current $I_{inj}$ via the capacitive element ($C_c$) 112 to a third node (N3).

In actual applications, the switching element 111 can be implemented with an NMOS transistor (represented by MN3 in FIG. 2), whose gate (control terminal) is connected to the signal input port $V_{in}$ for receiving the first injection signal $S_1$ from the signal input port $V_{in}$, whose source is connected to the first node (N1), i.e., the positive differential output port, and whose drain is connected to the second node (N2), i.e., the negative differential output port (OUT−).

Figure 5:
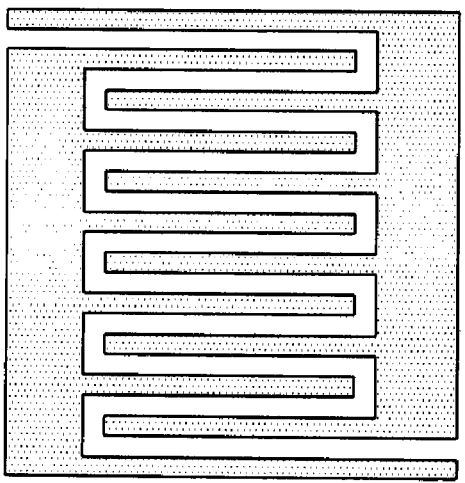
FIG. 5 shows a circuit layout of a comb-shaped dual metal layer IC layout architecture used to implement a capacitive element ($C_c$) utilized by the frequency dividing circuit of the invention.

Further, the capacitive element ($C_c$) 112 is implemented with a capacitor or any other functionally equivalent circuit, which is used to receive the second injection signal $S_2$ and capable of responsively inducing the generation of an electrical current (represented by $I_{inj}$ in FIG. 2) for injection into the third node (N3). In practical applications, for example, the capacitive element ($C_c$) 112 can be implemented with a comb-shaped dual metal layer IC (integrated circuit) layout architecture, as illustrated in FIG. 5.

In practical applications, the capacitive element ($C_c$) 112 can also be implemented with a capacitive coupler or a splitter for bifurcating the signal input $V_{in}$ into the two injection signals $S_1$, $S_2$. Beside these embodiments, various other alternatives are possible.

First Cross-Switching Circuit Module 120

The first cross-switching circuit module 120 is composed of a cross-coupled pair of first-type switching elements (which are in the embodiment of FIG. 2 implemented with a pair of PMOS transistors 121, 122 represented by MP1 and MP2), whose respective gates (control terminals) are connected respectively to the second node (N2) and the first node (N1), whose respective sources (first connecting terminals) are together connected to a system drive voltage $V_{DD}$, and whose respective drains (second connecting terminals) are respectively connected to the first node (N1) and the second node (N2). In operation, the first cross-switching circuit module 120 is capable of providing a cross-switching function to the first injection signal $S_1$ across the first node (N1) and the second node (N2).

Second Cross-Switching Circuit Module 130

The second cross-switching circuit module 130 is composed of a cross-coupled pair of switching elements which can be implemented with either NMOS or PMOS transistors (in the embodiment of FIG. 2, a pair of NMOS transistors 131, 132 represented by MN1 and MN2 are used).

In the case of NMOS implementation, the NMOS transistors 131, 132 are interconnected in such a manner that their respective gates (control terminals) are connected respectively to the second node (N2) and the first node (N1), their respective sources (first connecting terminals) are respectively connected to the first node (N1) and the second node (N2), and their respective drains (second connecting terminals) are together connected to the third node (N3). In operation, the second cross-switching circuit module 130 is capable of providing an inversed cross-switching function to the first injection signal $S_1$ across the first node (N1) and the second node (N2).

On the other hand, in the case of PMOS implementation, the circuit arrangement of the PMOS transistors is the same as the NMOS implementation except that their sources are in this case connected to the third node (N3).

First Resonant Circuit Module 140

The first resonant circuit module 140 is implemented with an inductor or a functionally equivalent circuit. FIG. 2 shows an example of implementation with an inductor $L_{tank}$ which is connected between the first node (N1) and the second node (N2) for providing a resonant effect to the first injection signal $S_1$ across the first node (N1) and the second node (N2).

Figure 6:
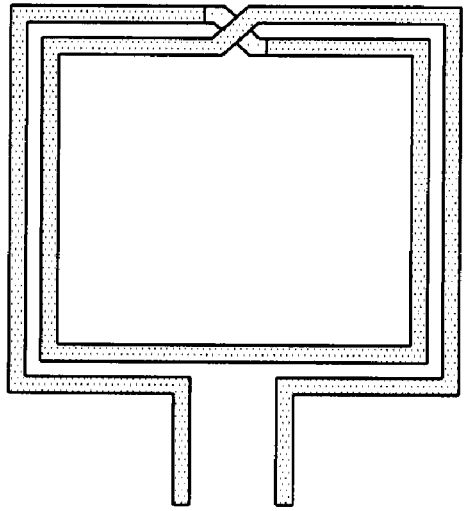
FIG. 6 shows a circuit layout of a ring-shaped dual metal layer IC layout architecture used to implement a first resonant circuit module ($L_{tank}$) utilized by the frequency dividing circuit of the invention.
Figure 7:
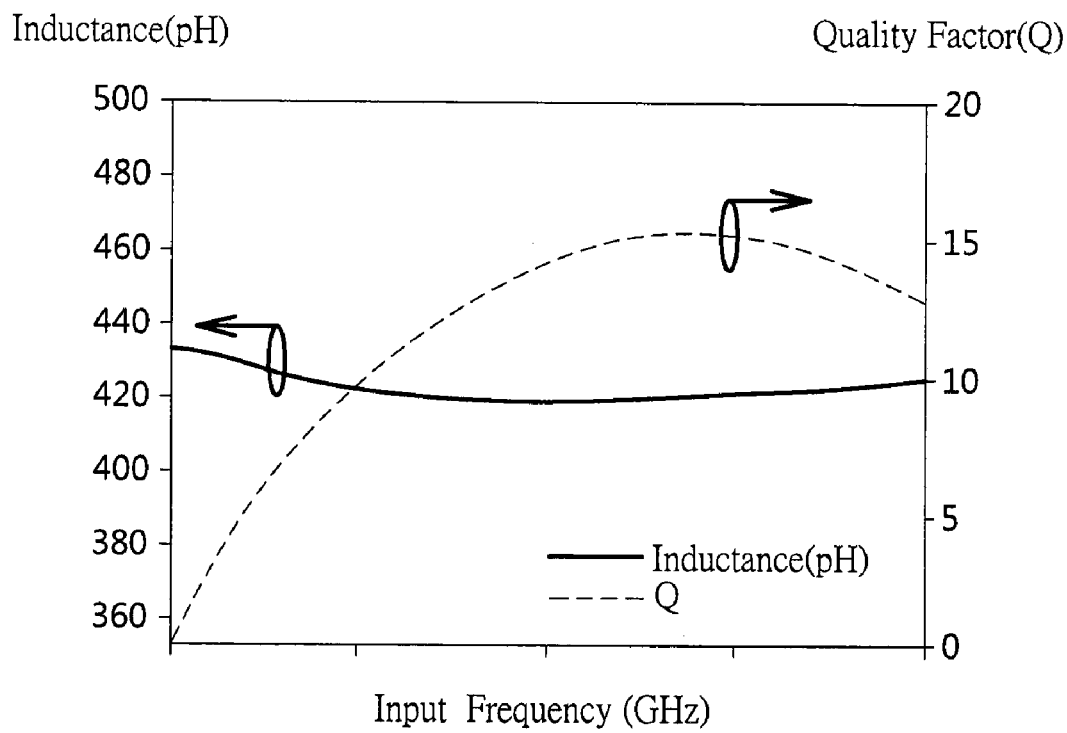
FIG. 7 is a graph showing an inductance versus input frequency characteristic plot and a quality factor (Q) versus input frequency characteristic plot for the frequency dividing circuit of the invention.

In practical applications, for example as illustrated in FIG. 6, this first resonant circuit module 140 can be implemented with a ring-shaped dual metal layer IC layout architecture. Further, FIG. 7 is a graph showing the inductance versus input frequency characteristic plot and quality factor (Q) versus input frequency characteristic plot for the frequency dividing circuit of the invention 100. As shown, when the input frequency is 23 GHz, it will cause the first resonant circuit module 140 to have an inductance of about 420 pH (picohenry) and a quality factor of Q=15. Since a larger value for Q implies a smaller frequency locking range, and a smaller value for Q implies larger power consumption, the design choice for the value of Q is based on a tradeoff scheme.

Second Resonant Circuit Module 150

The second resonant circuit module 150 is implemented with an LC circuit composed of an inductor 151 and a capacitor 152 which are connected in parallel between the third node (N3) and a grounding point GND. In operation, this second resonant circuit module 150 is capable of providing a resonant effect to the current $I_{inj}$ induced by the second injection signal $S_2$ across the capacitive element ($C_c$) 112.

In the implementation of the second resonant circuit module 150, the inductor 151 can be realized by using a coplanar waveguide (CPW), while the capacitor 152 can be realized by using the parasitic capacitance of the two NMOS transistors (MN1, MN2) of the second cross-switching circuit module 130.

Operation of the Invention

During actual operation of the frequency dividing circuit of the invention 100, the first injection signal $S_1$ will induce an electrical current $I_{inj\_v}$ to flows from the first node (N1) across the switching element (i.e., NMOS transistor NM3) 111 to the second node (N2).

FIG. 3A shows an equivalent circuit used to explain the response of the frequency dividing circuit of the invention to the first injection signal $S_1$. The effect caused by the inducted current $I_{inj\_v}$ can be explained by referring to a conventional frequency dividing circuit architecture (which is a direct injection locked type) shown in FIG. 3A. In the conventional circuit architecture of FIG. 3A, the transistor M3 is equivalent to the switching element (NMOS transistor NM3) 111 in the frequency dividing circuit of the invention 100 shown in FIG. 3, which can provide a signal mixing effect for the signal input $V_{in}$ and the oscillating signal generated by the oscillating circuit architecture (M1, M2, L1, L2), thereby generating the induced current $I_{inj\_v}$. The magnitude of $I_{inj\_v}$ is related to the input signal $V_{in}$ as follows:

$$I_{inj\_v} = \alpha \cdot I_{osc} \cdot \frac{2}{\pi} \cdot \left(1 - \frac{\sqrt{2} \cdot V_{OD}}{\pi \cdot V_{in}}\right)$$

where

α is the mixer conversion factor of the transistor M3;

$I_{osc}$ is the frequency of the oscillating signal generated by the second resonant circuit module 150;

$V_{OD}$ is the overdrive voltage of the transistor M3;

$V_{in}$ is the input signal.

The circuit architecture shown in FIG. 3A can provide a frequency locking range (represented by $\omega_L$) as follows:

$$\omega_L = \frac{\omega_0}{Q} \cdot \frac{I_{inj\_v}}{I_{osc}}$$

where $\omega_0$ is the frequency of the oscillating signal generated by the second resonant circuit module 150;

Q is the quality factor of the first resonant circuit module 140.

The above-mentioned equations are based on principle and theory disclosed in the following technical paper: "*Design of CMOS Frequency Dividers for 60 GHz Applications*" authored by Shuen-Yin Bai for MS Thesis, Department of Electronic Engineer at National Taiwan University, 2007); so detailed description thereof will not be given in this specification.

Further, the effect caused by the inducted current $I_{inj\_c}$ can be explained by referring to FIG. 3B, which shows an equivalent circuit used to explain the response of the frequency dividing circuit of the invention to the second injection signal $S_2$. Theoretically, the magnitude of $I_{inj\_c}$ is related to the current $I_{inj}$ induced by the second injection signal $S_2$ as follows:

$$|I_{inj\_c}| = \frac{2}{\pi} \cdot \beta \cdot |I_{inj}|$$

and $$\beta = \frac{Z_1}{Z_1 + Z_2}$$

where $Z_1$ is the impedance of the second resonant circuit module 150 measured at the third node (N3);

$Z_2$ is the impedance of the frequency dividing circuit of the invention 100 measured between first node (N1) and second node (N2).

Consequently, the frequency dividing circuit of the invention 100 shown in FIG. 2 is capable of providing a frequency locking range (represented by $\omega_L'$) as follows:

$$\omega_{L'} = \frac{\omega_0}{Q \cdot I_{osc}} \cdot (I_{inj\_v} + I_{inj\_c})$$

From the above equations, it can be seen that the frequency locking range provided by the invention is based on two parameters ($I_{inj\_v} + I_{inj\_c}$); whereas the frequency locking range provided by the prior art is based on only ($I_{inj\_v}$). As a result, the invention is able to provide a broader frequency locking range than the prior art.

Operating Characteristics of the Invention

The following is a description of some operating characteristics of the frequency dividing circuit of the invention 100 through circuit simulation and experimentation.

Figure 4A:
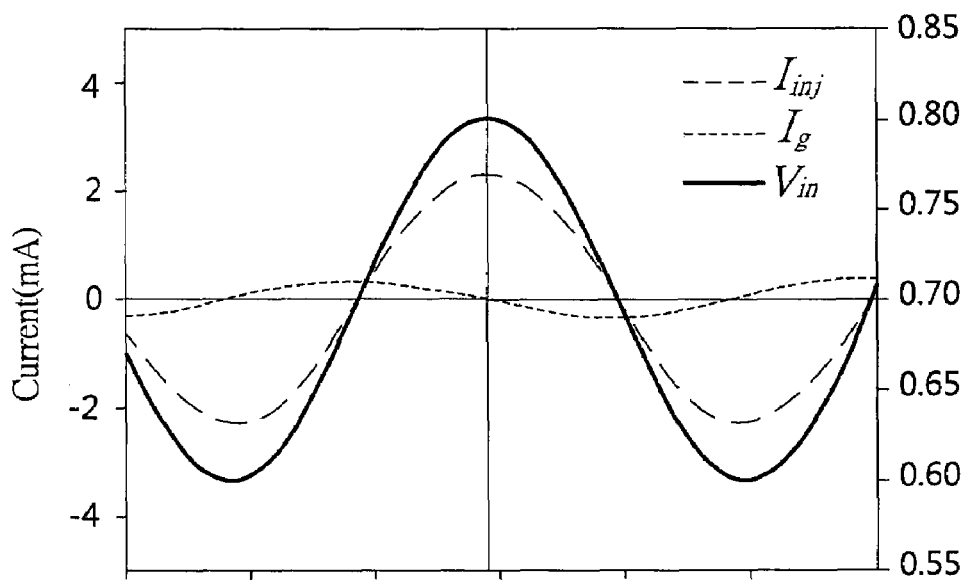
FIG. 4A is a graph showing characteristic plots of induced currents of the first injection signal and the second injection signal against the magnitude of the input signal for the frequency dividing circuit of the invention.

FIG. 4A is a graph showing characteristic plots of the induced current $I_g$ by the first injection signal $S_1$ and the induced current $I_{inj}$ by the second injection signal $S_2$ against the magnitude of the input signal $V_{in}$ for the frequency dividing circuit of the invention 100. It can be seen from this graph that the induced current $I_{inj}$ by the second injection signal $S_2$ is much greater in magnitude than the induced current $I_g$ by the first injection signal $S_1$. This operating characteristic feature allows the frequency dividing circuit of the invention 100 to operate with a broader frequency locking range.

Figure 4B:
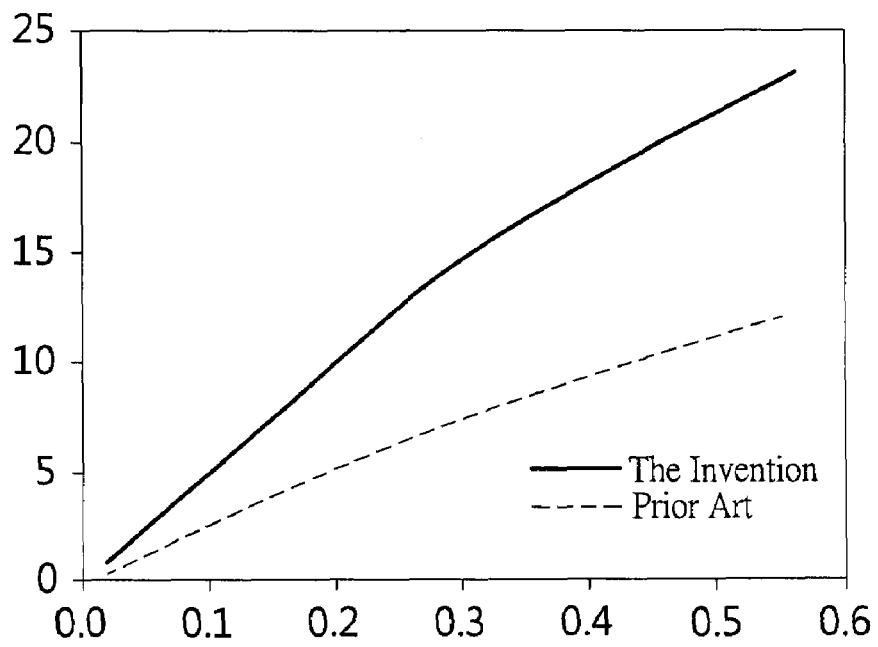
FIG. 4B is a graph showing a comparison between the respective frequency locking ranges achieved by the invention and the prior art.

FIG. 4B is a graph showing a comparison between the respective frequency locking ranges achieved by the invention and the prior art. It can be seen from this graph that when the input signal $V_{in}$ has an electrical power of 0 dBm (i.e., $V_{in}$=0.316 V), the frequency dividing circuit of the invention 100 can offer almost a twofold broader frequency locking range than the prior art.

In conclusion, the invention provides a dual-injection locked frequency dividing circuit for integration to a gigahertz signal processing circuit system, and which is characterized by the provision of a dual-injection interface module on the input end for dividing the input signal into two parts for use as two injection signals, wherein the first injection signal is rendered in the form of a voltage signal and injected through a direct injection manner to the internal oscillation circuitry, while the second injection signal is rendered in the form of an electrical current and injected through a resonant circuit to the internal oscillation circuitry. This feature allow the proposed frequency dividing circuit to have broad frequency locking range and low power consumption.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A dual-injection locked frequency dividing circuit having an input/output interface including a signal input port and a pair of differential output ports including a positive differential output port and a negative differential output port, for providing a frequency dividing function to an input signal at the signal input port;
    the dual-injection locked frequency dividing circuit comprising:
    a dual-injection interface module, which is used to bifurcate the input signal into at least two signals respectively serving as a first injection signal and a second injection signal; wherein the first injection signal is injected in a switched manner to both a first node and a second node where the first node is connected to the positive differential output port and the second node is connected to the negative differential output port, while the second injection signal is injected to a third node;
    a first cross-switching circuit module, for providing a cross-switching function to the first injection signal injected by the dual-injection interface module across the first node and the second node;
    a second cross-switching circuit module, for providing an inversed cross-switching function to the first injection signal injected by the dual-injection interface module across the first node and the second node;
    a first resonant circuit module, which is connected between the first node and the second node for providing a resonant effect to the first injection signal injected by the dual-injection interface module; and
    a second resonant circuit module, which is connected between the third node and a grounding point for providing a resonant effect to the second injection signal injected by the dual-injection interface module.

2. The dual-injection locked frequency dividing circuit of claim 1, wherein the dual-injection interface module includes a switching element for injecting the first injection signal in a switched manner to the first node and the second node.

3. The dual-injection locked frequency dividing circuit of claim 2, wherein the switching element in the dual-injection interface module is an NMOS transistor.

4. The dual-injection locked frequency dividing circuit of claim 1, wherein the dual-injection interface module includes a capacitive element, which is connected between the signal input port and the third node for providing a capacitive effect to the second injection signal.

5. The dual-injection locked frequency dividing circuit of claim 4, wherein the dual-injection interface module is implemented with a capacitive coupler.

6. The dual-injection locked frequency dividing circuit of claim 4, wherein the capacitive element in the dual-injection interface module is implemented with a comb-shaped dual metal layer integrated circuit layout architecture.

7. The dual-injection locked frequency dividing circuit of claim 1, wherein the dual-injection interface module is implemented with a splitter.

8. The dual-injection locked frequency dividing circuit of claim 1, wherein the first cross-switching circuit module is implemented with a PMOS-based circuit architecture.

9. The dual-injection locked frequency dividing circuit of claim 1, wherein the second cross-switching circuit module is implemented with a PMOS-based circuit architecture.

10. The dual-injection locked frequency dividing circuit of claim 1, wherein the second cross-switching circuit module is implemented with an NMOS-based circuit architecture.

11. The dual-injection locked frequency dividing circuit of claim 1, wherein the first resonant circuit module is implemented with an inductive element.

12. The dual-injection locked frequency dividing circuit of claim 11, wherein the inductive element is implemented with a ring-shaped dual metal layer integrated circuit layout architecture.

13. The dual-injection locked frequency dividing circuit of claim 10, wherein the second resonant circuit module is based on an LC (inductance-capacitance) circuit architecture whose inductance is implemented with a physical inductive element and whose capacitance is implemented with a parasite capacitance inherent to the NMOS-based circuit architecture of the first resonant circuit module.

14. The dual-injection locked frequency dividing circuit of claim 13, wherein the inductive element is implemented with a coplanar waveguide (CPW).

15. A dual-injection locked frequency dividing circuit having an input/output interface including a signal input port and a pair of differential output ports including a positive differential output port and a negative differential output port, for providing a frequency dividing function to an input signal at the signal input port;
    the dual-injection locked frequency dividing circuit comprising:
    a dual-injection interface module, which includes an NMOS-based switching element, and which is used to bifurcate the input signal into at least two signals respectively serving as a first injection signal and a second injection signal; wherein the first injection signal is injected in a switched manner via the NMOS-based switching element to both a first node and a second node where the first node is connected to the positive differential output port and the second node is connected to the negative differential output port, while the second injection signal is injected to a third node;
    a PMOS-based cross-switching circuit module, for providing a cross-switching function to the first injection signal injected by the dual-injection interface module across the first node and the second node;
    an NMOS-based cross-switching circuit module, for providing an inversed cross-switching function to the first injection signal injected by the dual-injection interface module across the first node and the second node;
    a first resonant circuit module, which is connected between the first node and the second node for providing a resonant effect to the first injection signal injected by the dual-injection interface module; and a second resonant circuit module, which is connected between the third node and a grounding point for providing a resonant effect to the second injection signal injected by the dual-injection interface module.

16. The dual-injection locked frequency dividing circuit of claim 15, wherein the dual-injection interface module includes a capacitive element, which is connected between the signal input port and the third node for providing a capacitive effect to the second injection signal.

17. The dual-injection locked frequency dividing circuit of claim 15, wherein the dual-injection interface module is implemented with a capacitive coupler.

18. The dual-injection locked frequency dividing circuit of claim 15, wherein the capacitive element in the dual-injection interface module is implemented with a comb-shaped dual metal layer integrated circuit layout architecture.

19. The dual-injection locked frequency dividing circuit of claim 16, wherein the dual-injection interface module is implemented with a splitter.

20. The dual-injection locked frequency dividing circuit of claim 15, wherein the first resonant circuit module is implemented with an inductive element.

21. The dual-injection locked frequency dividing circuit of claim 20, wherein the inductive element is implemented with a ring-shaped dual metal layer integrated circuit layout architecture.

22. The dual-injection locked frequency dividing circuit of claim 15, wherein the second resonant circuit module is based on an LC (inductance-capacitance) circuit architecture whose inductance is implemented with a physical inductive element and whose capacitance is implemented with a parasite capacitance inherent to the NMOS-based circuit architecture of the first resonant circuit module.

23. The dual-injection locked frequency dividing circuit of claim 22, wherein the inductive element is implemented with a coplanar waveguide (CPW).

* * * * *